(12) United States Patent
Ju et al.

(10) Patent No.: US 11,107,894 B2
(45) Date of Patent: Aug. 31, 2021

(54) GROUP III-V COMPOUND SEMICONDUCTOR DEVICE

(71) Applicant: KOREA INSTITUTE OF SCIENCE AND TECHNOLOGY, Seoul (KR)

(72) Inventors: Hyunsu Ju, Seoul (KR); Jin-Dong Song, Seoul (KR); Joonyeon Chang, Seoul (KR); Gyosub Lee, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 8 days.

(21) Appl. No.: 16/283,411

(22) Filed: Feb. 22, 2019

(65) Prior Publication Data
US 2019/0267453 A1   Aug. 29, 2019

(30) Foreign Application Priority Data

Feb. 23, 2018   (KR) .......................... 10-2018-0022204

(51) Int. Cl.
*H01L 29/205* (2006.01)
*H01L 29/66* (2006.01)
(Continued)

(52) U.S. Cl.
CPC ........ *H01L 29/205* (2013.01); *H01L 29/0808* (2013.01); *H01L 29/0821* (2013.01); *H01L 29/1008* (2013.01); *H01L 29/6625* (2013.01); *H01L 29/66318* (2013.01); *H01L 29/735* (2013.01); *H01L 29/737* (2013.01); *H01L 29/78* (2013.01)

(58) Field of Classification Search
CPC .......................... H01L 29/205; H01L 29/0808
See application file for complete search history.

(56) References Cited

U.S. PATENT DOCUMENTS

| 5,668,048 A | * | 9/1997 | Kondo | ................... B82Y 20/00 |
| | | | | 257/E21.11 |
| 5,728,605 A | * | 3/1998 | Mizutani | ................ H01L 33/18 |
| | | | | 438/41 |

(Continued)

FOREIGN PATENT DOCUMENTS

| JP | 0513328 A | 1/1993 |
| JP | 2013197305 A | 9/2013 |

(Continued)

OTHER PUBLICATIONS

Korean Notice of Allwance for corresponding Korean Patent Application No. 10-2018-0022204 dated Sep. 23, 2019, citing the above reference(s).

*Primary Examiner* — Trang Q Tran
(74) *Attorney, Agent, or Firm* — Cantor Colburn LLP

(57) ABSTRACT

Provided is a Group III-V compound semiconductor device. The device includes a substrate, a compound semiconductor layer provided on the substrate; and a buffer layer interposed between the compound semiconductor layer and the substrate. The compound semiconductor layer includes a first semiconductor area having a first conductivity type and a second semiconductor area having a second conductivity type. The buffer layer includes a high electron density area. In the buffer layer, an electron density of the high electron density area is higher than an electron density outside the high electron density area.

18 Claims, 6 Drawing Sheets

(51) Int. Cl.
   *H01L 29/737*   (2006.01)
   *H01L 29/78*    (2006.01)
   *H01L 29/08*    (2006.01)
   *H01L 29/735*   (2006.01)
   *H01L 29/10*    (2006.01)

(56)  References Cited

U.S. PATENT DOCUMENTS

| | | |
|---|---|---|
| 7,429,747 B2 | 9/2008 | Hudait et al. |
| 8,629,012 B2 | 1/2014 | Lin et al. |
| 10,256,333 B2 | 4/2019 | Pei |
| 2013/0242618 A1 | 9/2013 | Yamada |
| 2017/0077340 A1* | 3/2017 | Sato .................... H01L 31/0687 |

FOREIGN PATENT DOCUMENTS

| | | |
|---|---|---|
| JP | 2017528912 A | 9/2017 |
| KR | 1020180023686 A | 3/2018 |

* cited by examiner

GROUP III-V COMPOUND SEMICONDUCTOR DEVICE

CROSS-REFERENCE TO RELATED APPLICATIONS

This U.S. non-provisional patent application claims priority under 35 U.S.C. § 119 of Korean Patent Application No. 10-2018-0022204, filed on Feb. 23, 2018, the entire contents of which are hereby incorporated by reference.

BACKGROUND

The present disclosure herein relates to a Group III-V compound semiconductor device.

As a next-generation semiconductor material after silicon, attempts have been made to use Group III-V semiconductors. In order to utilize a Group III-V semiconductor as an electronic device, a process for forming areas having conductivity types (for example, an n-type area and a p-type area) must be performed.

SUMMARY

The present disclosure is to provide a Group III-V compound semiconductor device having improved electrical characteristics.

The inventive concept is also to provide a Group III-V compound semiconductor device having an advantage in circuit design.

An embodiment of the inventive concept provides a Group III-V compound semiconductor device including: a substrate; a compound semiconductor layer provided on the substrate; and a buffer layer interposed between the compound semiconductor layer and the substrate, wherein the compound semiconductor layer includes: a first semiconductor area having a first conductivity type; and a second semiconductor area having a second conductivity type, wherein the buffer layer includes a high electron density area, wherein in the buffer layer, an electron density of the high electron density area is higher than an electron density outside the high electron density area.

In an embodiment the first semiconductor area may include a first Group V element, wherein the second semiconductor area may include the first Group V element and a second Group V element.

In an embodiment, the second Group V element may have an atomic number lower than that of the first Group V Element.

In an embodiment, a concentration ratio of the first Group V element and the second Group V element may be changed along a direction parallel to an upper surface of the substrate in the second semiconductor area.

In an embodiment, a band gap of the second semiconductor area may be equal to a band gap of the first semiconductor area.

In an embodiment, the high electron density area may be disposed below the second semiconductor area.

In an embodiment, the high electron density area may be provided in an upper part of the buffer layer.

In an embodiment, the high electron density area and the second semiconductor area may be in contact with each other.

In an embodiment, a lattice constant of the buffer layer may be smaller than a lattice constant of the first semiconductor area and larger than a lattice constant of the second semiconductor area.

In an embodiment, the first semiconductor area and the second semiconductor area may include the same Group III elements.

In an embodiment, the first semiconductor area may include GaSb, wherein the second semiconductor area may include GaAsSb.

In an embodiment, a thickness of the first semiconductor area and a thickness of the second semiconductor area may be substantially the same.

In an embodiment, a bottom surface of the first semiconductor area and a bottom surface of the second semiconductor area may be disposed at substantially the same level with each other.

In an embodiment, the first and second semiconductor regions may include a first Group V element and a second Group V element, respectively, wherein a ratio of the first and second Group V elements in the first semiconductor area may be different from a ratio of the first and second Group V elements in the second semiconductor area.

In an embodiment, a lattice constant of the buffer layer may be smaller than a lattice constant of the first semiconductor area and larger than a lattice constant of the second semiconductor area.

In an embodiment, a distribution of the second Group V element in the first semiconductor area and a distribution of the second Group V element in the second semiconductor area may be changed along a direction parallel to an upper surface of the substrate.

In an embodiment, the first semiconductor area and the second semiconductor area may be arranged in a direction parallel to an upper surface of the substrate, wherein the first semiconductor area and the second semiconductor area may be in contact with each other.

In an embodiment, the first semiconductor area may be provided in a pair, wherein the second semiconductor area may be disposed between the pair of first semiconductor areas.

In an embodiment, the second semiconductor area may be provided in a pair, wherein the first semiconductor area may be disposed between the pair of second semiconductor areas.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
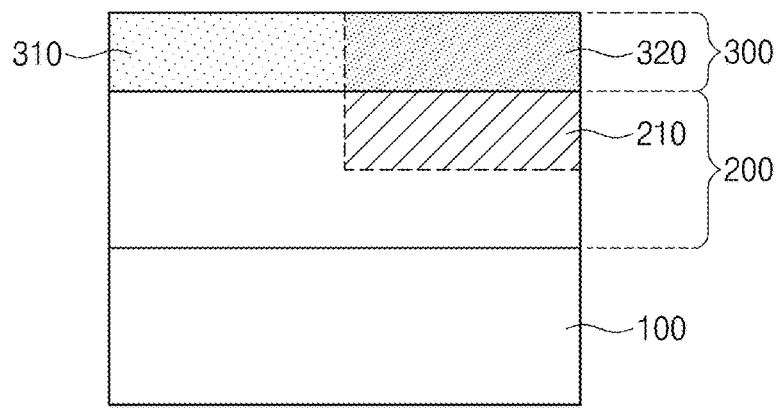
FIG. 1 is a cross-sectional view of a Group III-V compound semiconductor device according to exemplary embodiments of the inventive concept.

In order to fully understand the configuration and effects of the technical spirit of the inventive concept, preferred embodiments of the technical spirit of the inventive concept will be described with reference to the accompanying drawings. However, the technical spirit of the inventive concept is not limited to the embodiments set forth herein and may be implemented in various forms and various modifications may be applied thereto. Only, the technical spirit of the inventive concept is disclosed to the full through the description of the embodiments, and it is provided to those skilled in the art that the inventive concept belongs to inform the scope of the inventive concept completely.

Like reference numerals refer to like elements throughout the specification. Embodiments described herein will be described with reference to a perspective view, a front view, a sectional view, and/or a conceptual view, which are ideal examples of the technical idea of the inventive concept. In the drawings, the thicknesses of areas are exaggerated for effective description. Areas exemplified in the drawings have general properties, and are used to illustrate a specific shape of a semiconductor package region. Thus, this should not be construed as limited to the scope of the inventive concept. It will be understood that various terms are used herein to describe various components but these components should not be limited by these terms. These terms are just used to distinguish a component from another component. Embodiments described herein include complementary embodiments thereof.

The terms used in this specification are used only for explaining specific embodiments while not limiting the inventive concept. The terms of a singular form may include plural forms unless referred to the contrary. The meaning of "comprises," and/or "comprising" in this specification specifies the mentioned component but does not exclude at least one another component.

Hereinafter, preferred embodiments of the technical spirit of the inventive concept are described with reference to the accompanying drawings so that the inventive concept is described in more detail.

FIG. 1 is a cross-sectional view of a Group III-V compound semiconductor device according to exemplary embodiments of the inventive concept.

Referring to FIG. 1, a Group III-V compound semiconductor device 10 including a substrate 100, a buffer layer 200, and a compound semiconductor layer 300 may be provided. The substrate 100 may be a semiconductor substrate. For example, the substrate 100 may be a silicon (Si) substrate, a germanium (Ge) substrate, a silicon-germanium (SiGe) substrate, a silicon-carbide (SiC) substrate, or an indium-phosphorous (InP) substrate.

The buffer layer 200 may be provided on the substrate 100. The buffer layer 200 may provide stress to the first and second semiconductor areas 310 and 320 described later to improve carrier mobility therein. A band gap of the buffer layer 200 may be greater than a band gap of the compound semiconductor layer 300. The buffer layer 200 may have non-conductive character and may function as the insulation layer. The buffer layer 200 is shown as a single layer, but this is exemplary. In other exemplary embodiments, the buffer layer 200 may include a plurality of layers. For example, the buffer layer 200 may include at least one of AlGaSb, AlGaAsSb, AlGaP, AlGaAsP, AlSb, AlAsSb, AlInSb, AlInAsSb, InP, and SiN. In the exemplary embodiments, a doping layer (not shown) may be inserted into the buffer layer 200. For example, the doping layer may be a layer in which at least one of silicon (Si), bismuth (Bi), and tellurium (Te) is doped in the buffer layer 200.

A high electron density area 210 may be provided in the buffer layer 200. The high electron density area 210 may be disposed on the upper part of the buffer layer 200. The high electron density area 210 may be an area having a relatively high electron density in the buffer layer 200. That is, within the buffer layer 200, the electron density of the high electron density area 210 may be higher than the electron density outside the high electron density area 210. For example, the high electron density area 210 may be darker than other areas in a photograph taken with a transmission electron microscope (TEM). A band gap of the high electron density area 210 may be greater than a band gap of the compound semiconductor layer 300. The high electron density area 210 may have dielectric/insulative character.

The compound semiconductor layer 300 may be provided on the buffer layer 200. The compound semiconductor layer 300 may include a Group III-V compound semiconductor material. The compound semiconductor layer 300 may include a first semiconductor area 310 and a second semiconductor area 320. The first semiconductor area 310 and the second semiconductor area 320 may be arranged in a direction (substantially) parallel to the upper surface of the substrate 100.

The first semiconductor area 310 may include a Group III element and a first Group V element. For example, the Group III element may be gallium (Ga), aluminum (Al), or indium (In), and the first Group V element may be antimony (Sb). The first semiconductor area 310 may include GaSb, InSb, or GaInSb. The first semiconductor area 310 may have a first conductivity type. For example, the first conductivity type may be p-type. The lattice constant of the first semiconductor area 310 may be greater than the lattice constant of the buffer layer 200. A compressive stress may be applied to the first semiconductor area 310. Accordingly, a hole carrier mobility in the first semiconductor area 310 may be improved.

The second semiconductor area 320 may include a Group III element, a first Group V element, and a second Group V element. The Group III element and the first Group V element may be substantially the same as the Group III element and the first Group V Element contained in the first semiconductor area 310, respectively. The second Group V element may be different from the first Group V element. The atomic number of the second Group V element may be less than the atomic number of the first Group V element. For example, the second Group V element may be arsenic (As) or phosphorus (P). The second semiconductor area 320 may include GaAsSb, InAsSb, or GaInAsSb. The second semiconductor area 320 may have a second conductivity type. The second conductivity type may be different from the first conductivity type. For example, the second conductivity type may be n-type. The lattice constant of the second semiconductor area 320 may be less than the lattice constant of the buffer layer 200. That is, the lattice constant of the buffer layer 200 may be smaller than the lattice constant of the first semiconductor area 310 and larger than the lattice constant of the second semiconductor area 320. Tensile stress may act on the second semiconductor area 320. Thus, the electron carrier mobility in the second semiconductor area 320 may be improved.

The second semiconductor area 320 may be disposed on the high electron density area 210. In other words, a high electron density area 210 may be provided between the second semiconductor area 320 and the substrate 100. The second semiconductor area 320 and the high electron density area 210 may vertically overlap. The second semiconductor area 320 and the high electron density area 210 may be in contact with each other.

Compressive stress may be applied to the first semiconductor area 310 and tensile stress may be applied to the second semiconductor area 320 according to the concept of the inventive concept. Thus, the hole carrier mobility in the first semiconductor area 310 and the electron carrier mobility in the second semiconductor area 320 may be improved. As a result, the electrical characteristics of the Group III-V compound semiconductor device 10 may be improved.

In exemplary embodiments, the band gap of the second semiconductor area 320 may be equal to the band gap of the first semiconductor area 310. Off voltage characteristics of the first semiconductor area 310 and the second semiconductor area 320 may be the same. The off voltage characteristic is a voltage difference between the source electrode and the drain electrode that causes a certain amount of current (generally referred to as a target off current) to flow between the source electrode and the drain electrode when the gate voltage of the transistor is 0 V, for example.

In general, when off voltages of semiconductor areas having different conductivity types are different, it should be considered when designing a circuit that off voltages of semiconductor are different. Since the first and second semiconductor areas 320 according to exemplary embodiments of the inventive concept are equal in off voltage, there is an advantage that the variables considered in the circuit design are reduced. According to exemplary embodiments, the thicknesses of the first and second semiconductor areas 310 and 320 may be substantially equal to one another. The top and bottom surfaces of the first semiconductor area 310 may be disposed at substantially the same level as the top and bottom surfaces of the second semiconductor area 320, respectively.

Generally, the band gap of the semiconductor layer may vary depending on the constituent material and thickness of the semiconductor layer. The first and second semiconductor areas 310 and 320 according to the inventive concept may have the same thickness. Thus, the concentration of the second Group V element in the second semiconductor area 320 may be controlled to control the band gap of the second semiconductor area 320.

Figure 2:
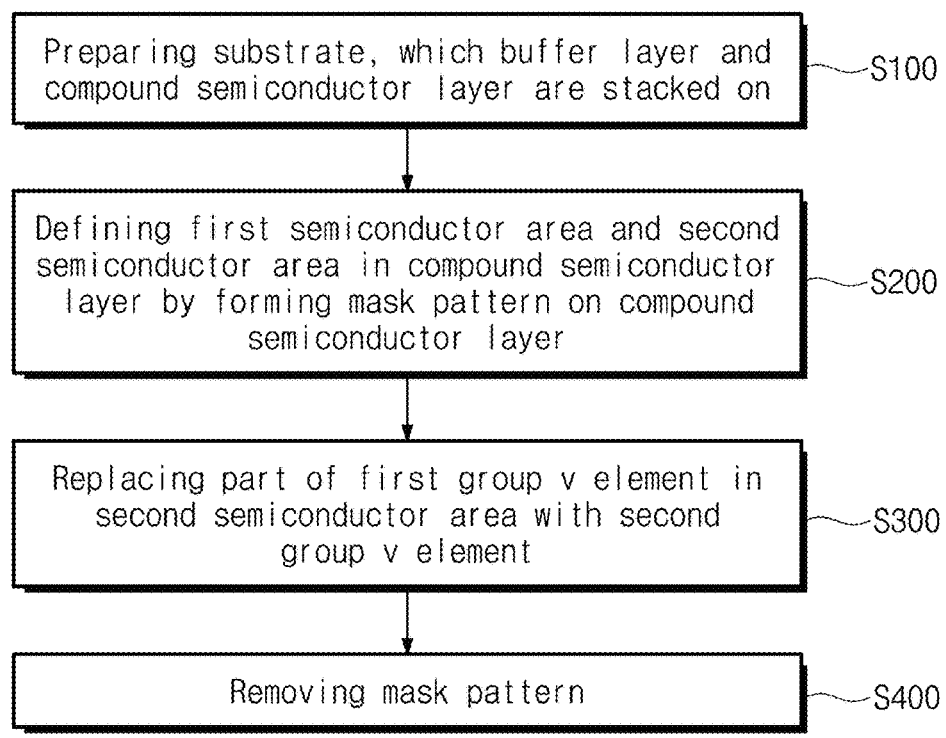
FIG. 2 is a flowchart illustrating a method of manufacturing a Group III-V compound semiconductor device according to exemplary embodiments of the inventive concept.
Figure 3:
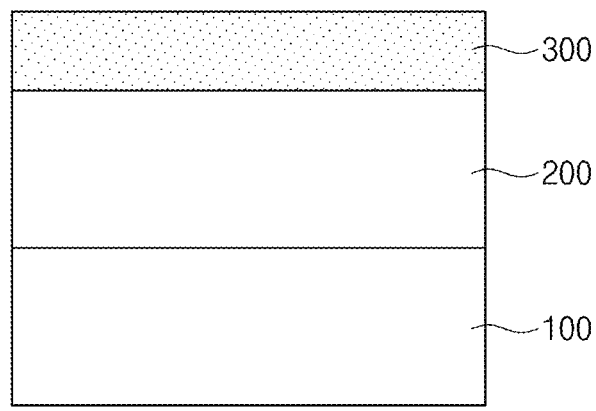
FIGS. 3 to 5 are cross-sectional views illustrating a method of manufacturing a Group III-V compound semiconductor device according to exemplary embodiments of the inventive concept.
Figure 4:
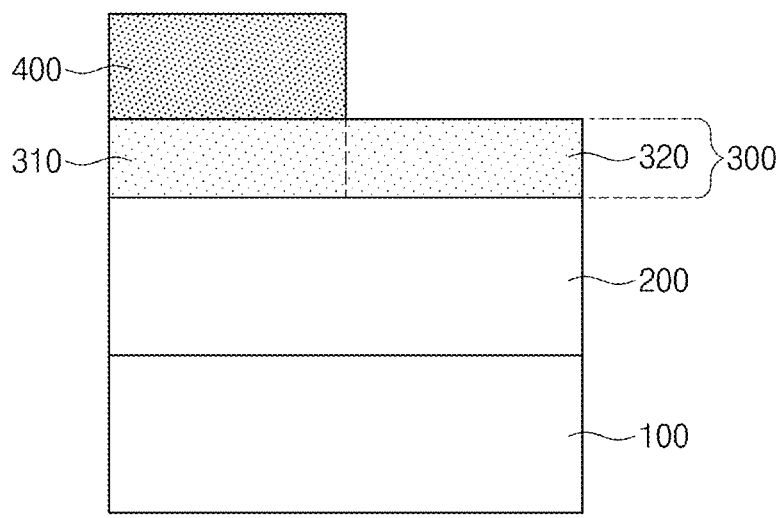
Figure 5:
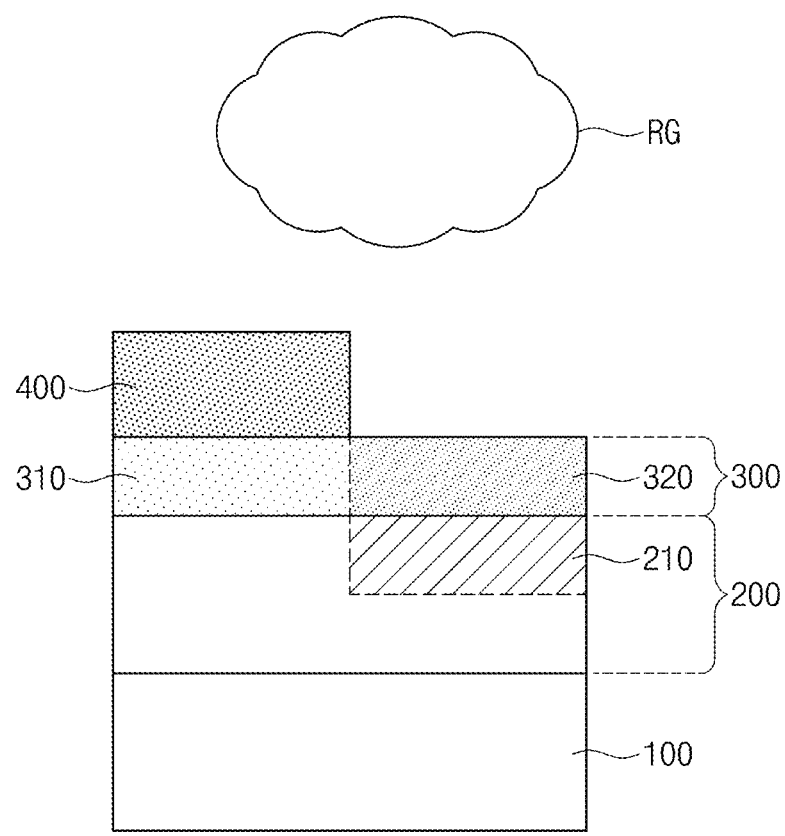

FIG. 2 is a flowchart illustrating a method of manufacturing a Group III-V compound semiconductor device according to exemplary embodiments of the inventive concept. FIGS. 3 to 5 are cross-sectional views illustrating a method of manufacturing a Group III-V compound semiconductor device according to exemplary embodiments of the inventive concept.

Referring to FIGS. 2 to 3, a substrate 100 may be prepared. The substrate 100 may be a semiconductor substrate. For example, the substrate 100 may be a silicon (Si) substrate, a germanium (Ge) substrate, a silicon-germanium (SiGe) substrate, a silicon-carbide (SiC) substrate, or an indium-phosphorous (InP) substrate.

The buffer layer 200 and the compound semiconductor layer 300 may be stacked on the substrate 100 (S100). The buffer layer 200 and the compound semiconductor layer 300 may be sequentially formed on the substrate 100. Forming the buffer layer 200 may include performing a deposition process. For example, the buffer layer 200 may be formed by performing a chemical vapor deposition (CVD) process, a physical vapor deposition (PVD) process, or a molecular beam epitaxy (MBE) process. For example, the buffer layer 200 may include at least one of AlGaSb, AlGaAsSb, AlGaP, AlGaAsP, AlSb, AlAsSb, AlInSb, AlInAsSb, InP, and SiN.

Forming the compound semiconductor layer 300 may include performing a deposition process. For example, the compound semiconductor layer 300 may be formed by performing a chemical vapor deposition (CVD) process, a physical vapor deposition (PVD), or a molecular beam epitaxy (MBE) process. The compound semiconductor layer 300 may include a Group III-V compound semiconductor material. For example, the compound semiconductor layer 300 may include GaSb, InSb, or GaInSb.

Referring to FIGS. 2 and 4, a mask pattern 400 may be formed on a compound semiconductor layer 300 to define a first semiconductor area 310 and a second semiconductor area 320 (S200). The mask pattern 400 may be disposed on the first semiconductor area 310 to expose an upper surface of the second semiconductor area 320. The mask pattern 400 may vertically overlap the first semiconductor area 310.

In the exemplary embodiments, forming the mask pattern 400 includes forming a mask film (not shown) on the first and second semiconductor areas 310 and 320 and removing the mask film on the second semiconductor area 320. For example, the mask pattern 400 may be a photoresist pattern.

Each of the first and second semiconductor areas 310 and 320 may have a first conductivity type. For example, the conductivity type of each of the first and second semiconductor areas 310 and 320 may be p-type. The lattice constant of each of the first and second semiconductor areas 310 and 320 may be greater than the lattice constant of the buffer layer 200. Accordingly, compressive stress may be applied to the first and second semiconductor areas 310 and 320.

Referring to FIGS. 2 and 5, a part of the first Group V element in the second semiconductor area 320 may be replaced with a second Group V element (S300). In exemplary embodiments, the replacement process may include exposing the second semiconductor area 320 to the reactive gas RG. For example, the reaction gas RG may include a second Group V element gas or a mixed gas containing a second Group V element.

The atomic number of the second Group V element may be less than the atomic number of the first Group V element. For example, the first Group V element may be antimony (Sb) and the second Group V element may be arsenic (As) or phosphorus (P). For example, the first semiconductor area 310 may include GaSb and the second semiconductor area 320 may include GaAsSb. In another example, the first semiconductor area 310 may include InSb and the second semiconductor area 320 may include InAsSb. In another example, the first semiconductor area 310 may include GaInSb and the second semiconductor area 320 may include GaInAsSb.

The second semiconductor area 320 may have a second conductivity type by the replacement process. For example, the conductivity type of the second semiconductor area 320 may be n-type. The lattice constant of the second semiconductor area 320 may be smaller than the lattice constant of the buffer layer 200 by the replacement process. Accordingly, tensile stress may act on the second semiconductor area 320.

As the lattice constant of the second semiconductor area 320 becomes smaller, the electron density of the buffer layer 200 adjacent to the second semiconductor area 320 may increase. Thus, a high electron density area 210 may be formed below the second semiconductor area 320. The high electron density area 210 may vertically overlap the second semiconductor area 320. That is, in the buffer layer 200, the electron density of the high electron density area 210 may be higher than the electron density outside the high electron density area 210.

Referring to FIGS. 1 and 2, the mask pattern 400 may be removed (S400). Thus, a Group III-V compound semiconductor device 10 may be provided.

Generally, the n-type area and the p-type area of a Group III-V compound semiconductor device may be formed by separate deposition processes, respectively. Formation of the n-type area and the p-type area through separate deposition processes requires repeated deposition and removal processes. Therefore, a large amount of process cost and process time are required.

The first semiconductor area 310 and the second semiconductor area 320 according to the inventive concept may be formed by a replacement process performed on the compound semiconductor layer 300. The replacement process may have shorter process time than that of the deposition and removal processes, and the process cost of the replacement process may be lower than that of the deposition and removal processes. Thus, the process cost and process time may be minimized.

Generally, the upper part of the film disposed under the etch target film during over-etching may be over-etched. When the n-type area and the p-type area are formed through separate deposition processes, the n-type area and the p-type area may have different thicknesses due to the over-etching. If the thicknesses of the n-type area and the p-type area are different, the band gaps of the two areas may be difficult to precisely control. As a result, a Group III-V compound semiconductor device including n-type and p-type areas formed by separate deposition processes may be difficult to have the required properties.

The first semiconductor area 310 and the second semiconductor area 320 according to the inventive concept may be formed by the replacement process performed on the compound semiconductor layer 300. Accordingly, the first and second semiconductor areas 310 and 320 may have substantially the same thickness. Accordingly, the band gaps of the first semiconductor area 310 and the second semiconductor area 320 may be precisely controlled. As a result, a Group III-V compound semiconductor device including the first and second semiconductor areas 310 and 320 may have required characteristics.

Figure 6:
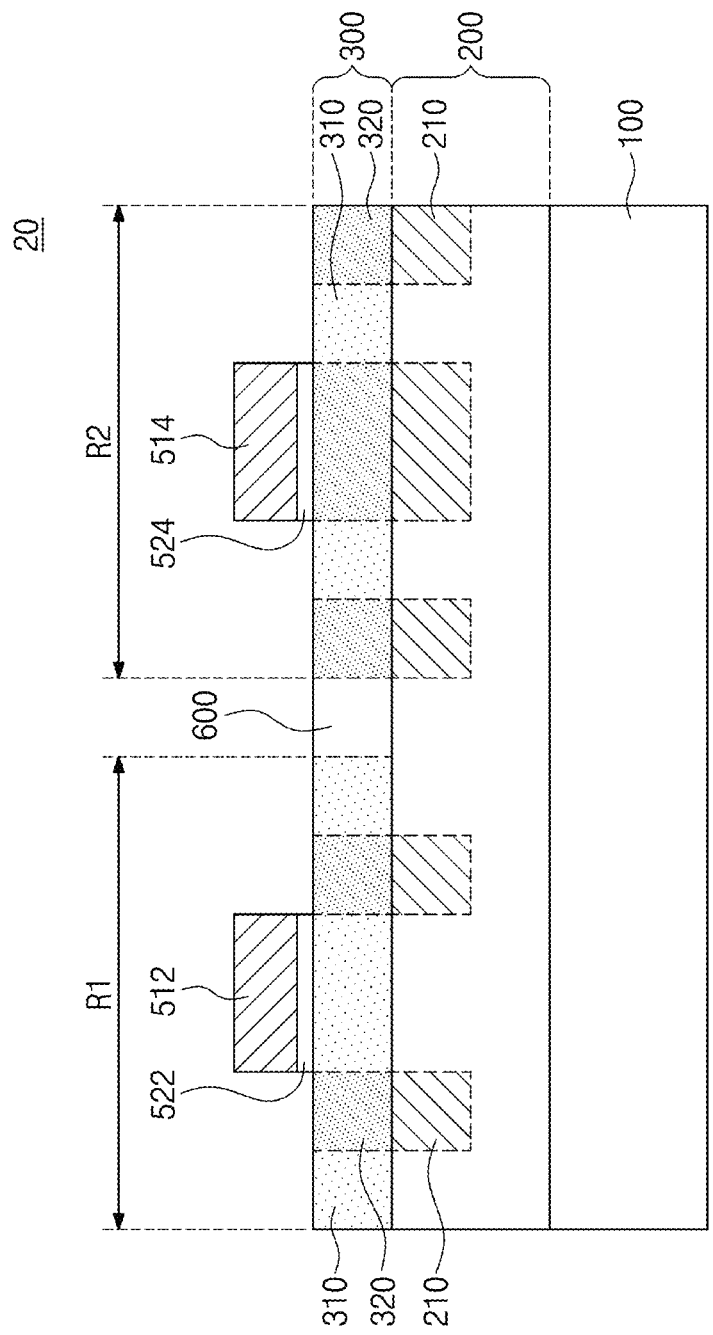
FIG. 6 is a cross-sectional view of a Group III-V compound semiconductor device according to exemplary embodiments of the inventive concept.

FIG. 6 is a cross-sectional view of a Group III-V compound semiconductor device according to exemplary embodiments of the inventive concept. For conciseness of description, contents substantially identical to the contents described with reference to FIG. 1 are not described.

Referring to FIG. 6, a Group III-V compound semiconductor device 20 including a substrate 100, a buffer layer 200, a compound semiconductor layer 300, an element isolation film 600, a first gate insulating film 522, a second gate insulating film 524, a first gate electrode 512, and a second gate electrode 514 may be provided. The Group III-V compound semiconductor device 20 may include a Complementary Metal-Oxide-Semiconductor Field Effect Transistor (CMOSFET). The Group III-V compound semiconductor device 20 may include a first area R1 and a second area R2. For example, the first area R1 may be an n-MOSFET area and the second area R2 may be a p-MOSFET area.

The substrate 100 and the buffer layer 200 may be substantially the same as the substrate 100 and the buffer layer 200 described with reference to FIG. 1. The buffer layer 200 may include high electron density areas 210.

The compound semiconductor layer 300 may be provided on the buffer layer 200. Within the first area R1, the compound semiconductor layer 300 may include first semiconductor areas 310 and a pair of second semiconductor areas 320. The first semiconductor areas 310 and the pair of second semiconductor areas 320 may be alternately arranged. For example, each of the pair of second semiconductor areas 320 may be disposed between the first semiconductor areas 310 immediately adjacent to each other. The pair of second semiconductor areas 320 may be a source area and a drain area of the transistor, respectively. For example, one of the pair of second semiconductor areas 320 may be a source area of the transistor, and another one of the pair of second semiconductor areas 320 may be a drain area of the transistor.

Within the second area R2, the compound semiconductor layer 300 may include a pair of first semiconductor areas 310 and second semiconductor areas 320. A pair of first semiconductor areas 310 and second semiconductor areas 320 may be alternately arranged. For example, each of the pair of first semiconductor areas 310 may be disposed between the second semiconductor areas 310 immediately adjacent to each other. The pair of first semiconductor areas 310 may be a source area and a drain area of the transistor, respectively.

The element isolation film 600 may be disposed between the compound semiconductor layer 300 in the first area R1 and the compound semiconductor layer 300 in the second area R2. The element isolation film 600 may be directly in contact with the buffer layer 200 through the compound semiconductor layer 300. The thickness of the element isolation film 600 may be equal to or greater than the thickness of the compound semiconductor layer 300. The element isolation film 600 may electrically disconnect the compound semiconductor layer 300 in the first area R1 and the compound semiconductor layer 300 in the second area R2. The element isolation film 600 may include an insulating material. For example, the element isolation film 600 may include silicon oxide (e.g., $SiO_2$), silicon nitride (e.g., SiN), or silicon oxynitride (e.g., SiON).

First and second gate insulating films 522 and 524 may be provided on the compound semiconductor layer 300. From a plan viewpoint, the first gate insulating film 522 may be disposed between a pair of second semiconductor areas 320 in the first area R1. From a plan viewpoint, the second gate insulating film 524 may be disposed between a pair of first semiconductor areas 320 in the second area R2. The first and second gate insulating films 522 and 524 may include a high dielectric material (e.g., $ZrO_2$, $HfO_2$, $Y_2O_3$, $Al_2O_3$, and $SiO_2$) and/or a Group III-V compound semiconductor material (e.g., AlGaSb, AlGaAsSb, AlN, and InP) having a band gap greater than that of the compound semiconductor layer 300.

First and second gate electrodes 512 and 514 may be provided on the first and second gate insulating films 522 and 524, respectively. The first and second gate electrodes 512 and 514 may be electrically disconnected from the compound semiconductor layer 300 by the first and second gate insulating films 522 and 524, respectively. The first and second gate electrodes 512 and 514 may include a conductive material. For example, the second gate electrodes 512 and 514 may include metal or doped silicon. When a voltage equal to or higher than the threshold voltage is applied to the first gate electrode 512, a channel may be formed in the first semiconductor area 310 between the pair of second semiconductor areas 320 in the first area R1. When a voltage equal to or higher than the threshold voltage is applied to the second gate electrode 514, a channel may be formed in the second semiconductor area 320 between the pair of first semiconductor areas 310 in the second area R2.

Compressive stress may be applied to the first semiconductor areas 310 and tensile stress may be applied to the second semiconductor areas 320 according to the concept of the inventive concept. Thus, the hole carrier mobility in the first semiconductor area 310 and the electron carrier mobility in the second semiconductor area 320 may be improved. As a result, the electrical characteristics of the Group III-V compound semiconductor device 20 may be improved.

Figure 7:
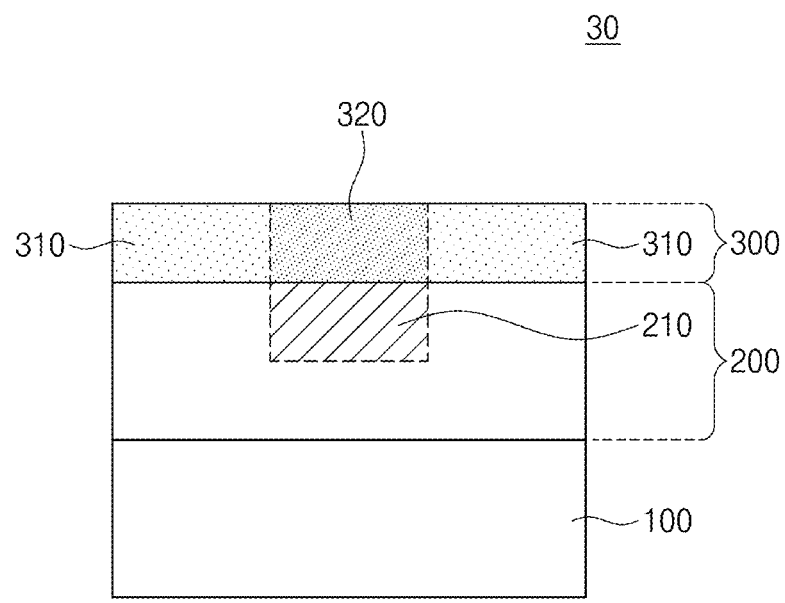
FIG. 7 is a cross-sectional view of a Group III-V compound semiconductor device according to exemplary embodiments of the inventive concept.

FIG. 7 is a cross-sectional view of a Group III-V compound semiconductor device according to exemplary embodiments of the inventive concept. For conciseness of description, contents substantially identical to the contents described with reference to FIG. 1 are not described.

Referring to FIG. 7, a Group III-V compound semiconductor device 30 including a substrate 100, a buffer layer 200, a high electron density area 210, a compound semiconductor layer 300, a pair of first semiconductor areas 310, and a second semiconductor area 320 may be provided. The Group III-V compound semiconductor device 30 may include a pnp-type bipolar junction transistor (BJT).

The substrate 100, the buffer layer 200, the high electron density area 210, the compound semiconductor layer 300, and the second semiconductor area 320 may be substantially the same as the substrate 100, the buffer layer 200, the high electron density area 210, the compound semiconductor layer 300, and the second semiconductor area 320 described with reference to FIG. 1.

Each of the pair of first semiconductor areas 310 may be substantially the same as the first semiconductor area 310 described with reference to FIG. 1. A pair of first semiconductor areas 310 may be spaced apart from each other along a direction (substantially) parallel to the upper surface of the substrate 100 with the second semiconductor area 320 therebetween. A pair of first semiconductor areas 310 may be electrically disconnected from each other by a second semiconductor area 320. The second semiconductor area 320 may be disposed on the high electron density area 210. The second semiconductor area 320 may vertically overlap the high electron density area 210. A pair of first semiconductor areas 310 may be an emitter and a collector of a bipolar junction transistor, respectively, and a second semiconductor area 320 may be a base.

Compressive stress may be applied to a pair of first semiconductor areas 310 and tensile stress may be applied to the second semiconductor area 320 according to the concept of the inventive concept. Thus, the hole carrier mobility in a pair of first semiconductor areas 310 and the electron carrier mobility in the second semiconductor area 320 may be improved. As a result, the electrical characteristics of the Group III-V compound semiconductor device 30 may be improved.

Figure 8:
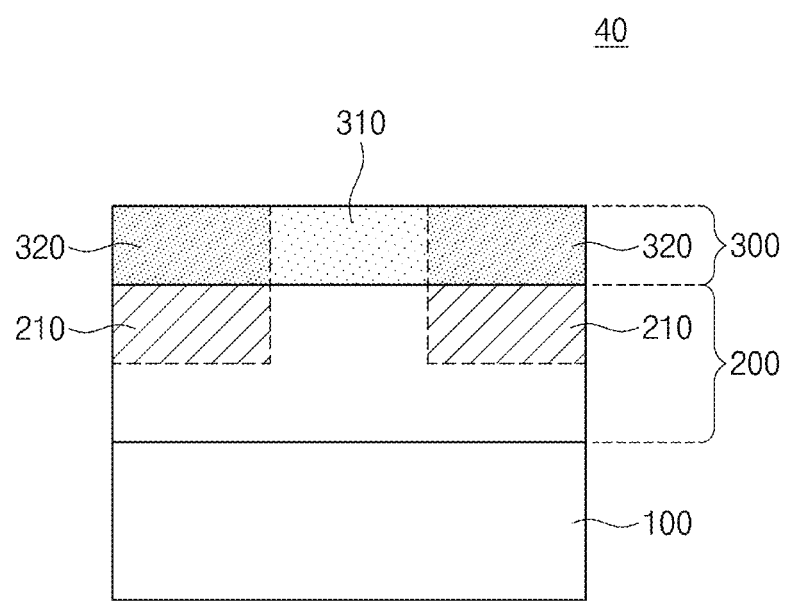
FIG. 8 is a cross-sectional view of a Group III-V compound semiconductor device according to exemplary embodiments of the inventive concept.

FIG. 8 is a cross-sectional view of a Group III-V compound semiconductor device according to exemplary embodiments of the inventive concept. For conciseness of description, contents substantially identical to the contents described with reference to FIG. 1 are not described.

Referring to FIG. 8, a Group III-V compound semiconductor device 40 including a substrate 100, a buffer layer 200, a pair of high electron density areas 210, a compound semiconductor layer 300 may be provided. The compound semiconductor layer 300 may include a first semiconductor area 310 and a pair of second semiconductor areas 320. The Group III-V compound semiconductor device 40 may be an npn-type bipolar junction transistor (BJT).

The substrate 100, the buffer layer 200, the compound semiconductor layer 300, and the first semiconductor area 310 may be substantially the same as the substrate 100, the buffer layer 200, the compound semiconductor layer 300, and the first semiconductor area 310 described with reference to FIG. 1.

Each of the pair of second semiconductor areas 320 may be substantially the same as the second semiconductor area 320 described with reference to FIG. 1. A pair of second semiconductor areas 320 may be spaced apart from each other along a direction parallel to the upper surface of the substrate 100 with the first semiconductor area 310 therebetween. A pair of second semiconductor areas 320 may be electrically disconnected from each other by a first semiconductor area 310. A pair of second semiconductor areas 320 may be disposed on a pair of high electron density areas 210, respectively. A pair of second semiconductor areas 320 may vertically overlap a pair of high electron density areas 210. The first semiconductor area 310 may be the base of the bipolar junction transistor and the pair of second semiconductor areas 320 may be an emitter and a collector, respectively.

Compressive stress may act on the first semiconductor area 310 and tensile stress may act on the pair of second semiconductor areas 320 according to the inventive concept. Accordingly, the hole carrier mobility in the first semiconductor area 310 and the electron carrier mobility in the pair of second semiconductor areas 320 may be improved. As a result, the electrical characteristics of the Group III-V compound semiconductor device 40 may be improved.

Figure 9:
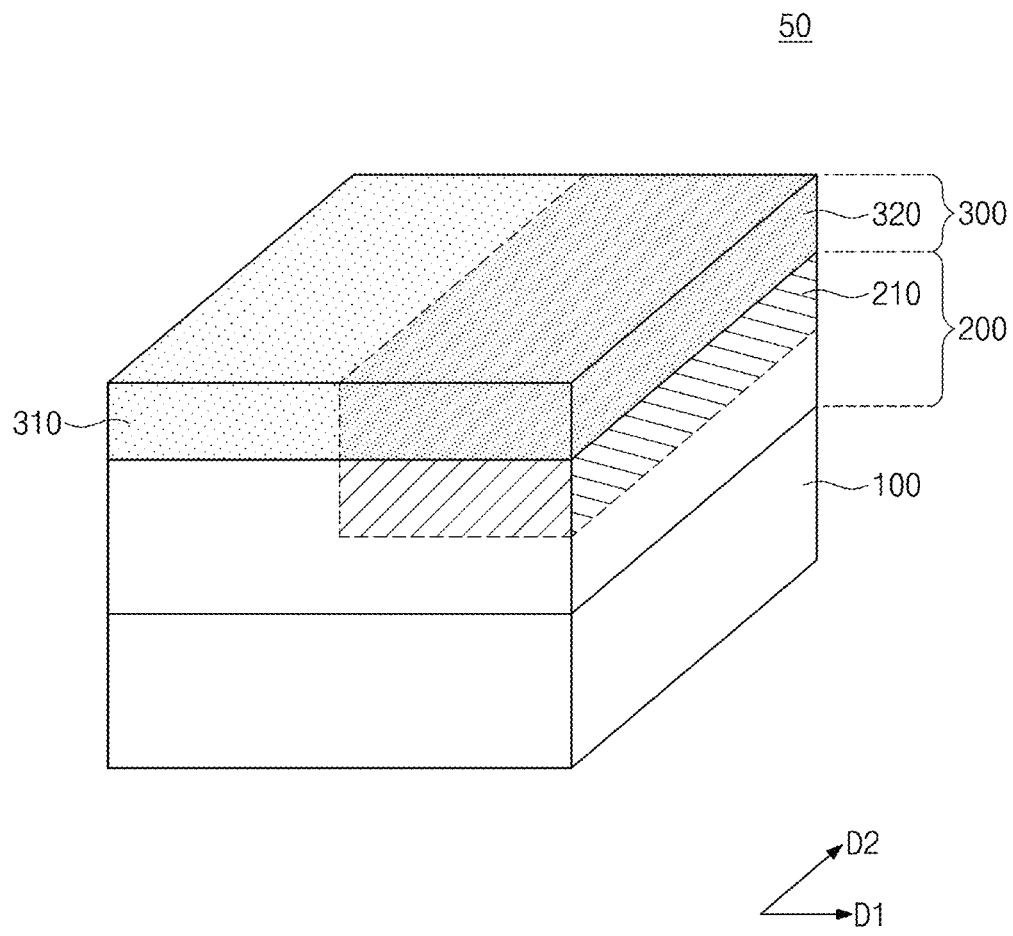
FIG. 9 is a perspective view of a Group III-V compound semiconductor device according to exemplary embodiments of the inventive concept.

FIG. 9 is a cross-sectional view of a Group III-V compound semiconductor device according to exemplary embodiments of the inventive concept. For conciseness of description, contents substantially identical to the contents described with reference to FIG. 1 are not described.

Referring to FIG. 9, a Group III-V compound semiconductor device 50 including a substrate 100, a buffer layer 200, a high electron density area 210, a compound semiconductor layer 300, a first semiconductor area 310, and a second semiconductor area 320 may be provided.

The substrate 100 and the buffer layer 200 may be substantially the same as the substrate 100 and the buffer layer 200 described with reference to FIG. 1. The first semiconductor area 310 may be substantially the same as the first semiconductor area 310 described with reference to FIG. 1, except for materials and the concentration ratio thereof in the first semiconductor area 310. That is, the first semiconductor area 310 may have a first conductivity type, and the lattice constant of the first semiconductor area 310 may be greater than the lattice constant of the buffer layer 200. The first semiconductor area 310 may include a Group III element, a first Group V element, and a second Group V element. For example, the first semiconductor area 310 may include GaAsSb, InAsSb, or GaInAsSb.

In the exemplary embodiments, the concentration ratio of the first Group V element and the second Group V element in the first semiconductor area 310 may be changed along a first direction D1 parallel to the upper surface of the substrate 100 and/or a second direction D2 parallel to the upper surface of the substrate 100. Thus, if areas with different carrier mobilities are required in the first semiconductor area 310, the carrier mobility may be controlled by adjusting the concentration ratio of first and second Group V elements of the areas.

The second semiconductor area 320 may be substantially the same as the second semiconductor area 320 described with reference to FIG. 1, except for the concentration ratio of a material in the second semiconductor area 320. That is, the second semiconductor area 320 may have a second conductivity type, and the lattice constant of the second semiconductor area 320 may be less than the lattice constant of the buffer layer 200. The second semiconductor area 320 may include GaAsSb, InAsSb, or GaInAsSb.

The concentration ratio of the first Group V element and the second Group V element in the second semiconductor area 320 may be different from the concentration ratio of the first Group V element and the second Group V element in the first semiconductor area 310. The minimum concentration of the second Group V elements in the second semiconductor area 320 may be greater than the maximum concentration of the second Group V elements in the first semiconductor area 310. The maximum concentration of the first Group V elements in the second semiconductor area 310 may be less than the minimum concentration of the first Group V elements in the first semiconductor area 310.

The concentration ratio of the first Group V elements and the second Group V Elements in the second semiconductor area 320 may be changed along a first direction D1 parallel to the upper surface of the substrate 100 and a second direction D2 parallel to the upper surface of the substrate 100. Thus, if areas with different carrier mobilities are required in the second semiconductor area 320, the carrier mobility may be controlled by adjusting the concentration ratio of the first and second Group V elements of the areas.

According to the inventive concept, a Group III-V compound semiconductor device with improved carrier mobility may be provided.

According to the inventive concept, a semiconductor area of a Group III-V compound semiconductor device may have a controllable band gap.

However, the effects of the inventive concept may not be limited to the above disclosure.

Although the exemplary embodiments of the inventive concept have been described, it is understood that the inventive concept should not be limited to these exemplary embodiments but various changes and modifications may be made by one ordinary skilled in the art within the spirit and scope of the inventive concept as hereinafter claimed.

What is claimed is:

1. A Group III-V compound semiconductor device comprising:
a substrate;
a compound semiconductor layer provided on the substrate; and
a buffer layer interposed between the compound semiconductor layer and the substrate,
wherein the compound semiconductor layer comprises:
a first semiconductor area having a first conductivity type; and
a second semiconductor area having a second conductivity type,
wherein the buffer layer comprises a high electron density area,
wherein within the buffer layer, an electron density of the high electron density area is higher than an electron density beside the high electron density area,
wherein the first semiconductor area and the second semiconductor area are arranged in a direction parallel to an upper surface of the substrate,
wherein the first semiconductor area and the second semiconductor area are in physical contact with each other in the direction parallel to the upper surface of the substrate,
wherein the first semiconductor area comprises a first Group V element,
wherein the second semiconductor area comprises the first Group V element and a second Group V element.

2. The Group III-V compound semiconductor device of claim 1, wherein the second Group V element has an atomic number lower than that of the first Group V Element.

3. The Group III-V compound semiconductor device of claim 1, wherein a concentration ratio of the first Group V element and the second Group V element is changed along the direction parallel to the upper surface of the substrate in the second semiconductor area.

4. The Group III-V compound semiconductor device of claim 1, wherein a band gap of the second semiconductor area is equal to a band gap of the first semiconductor area.

5. The Group III-V compound semiconductor device of claim 1, wherein the high electron density area is disposed below the second semiconductor area.

6. The Group III-V compound semiconductor device of claim 1, wherein the high electron density area is provided in an upper part of the buffer layer.

7. The Group III-V compound semiconductor device of claim 1, wherein the high electron density area and the second semiconductor area are in contact with each other.

8. The Group III-V compound semiconductor device of claim 1, wherein the buffer layer is in physical contact with the first semiconductor area and a lattice constant of the buffer layer is smaller than a lattice constant of the first semiconductor area such that a compressive stress is applied to the first semiconductor area, and
the buffer layer is in physical contact with the second semiconductor area and the lattice constant of the buffer layer is larger than a lattice constant of the second semiconductor area such that a tensile stress is applied to the second semiconductor area.

9. The Group III-V compound semiconductor device of claim 1, wherein the first semiconductor area and the second semiconductor area comprise the same Group III elements.

10. The Group III-V compound semiconductor device of claim 1, wherein the first semiconductor area comprises GaSb,
wherein the second semiconductor area comprises GaAsSb.

11. The Group III-V compound semiconductor device of claim 1, wherein a thickness of the first semiconductor area and a thickness of the second semiconductor area are substantially the same.

12. The Group III-V compound semiconductor device of claim 11, wherein a bottom surface of the first semiconductor area and a bottom surface of the second semiconductor area are disposed at substantially the same level with each other.

13. A Group III-V compound semiconductor device comprising:
a substrate;
a compound semiconductor layer provided on the substrate; and
a buffer layer interposed between the compound semiconductor layer and the substrate,
wherein the compound semiconductor layer comprises:
a first semiconductor area having a first conductivity type; and a second semiconductor area having a second conductivity type, wherein the buffer layer comprises a high electron density area, wherein within the buffer layer, an electron density of the high electron density area is higher than an electron density beside the high electron density area, wherein the first semiconductor area and the second semiconductor area are arranged in a direction parallel to an upper surface of the substrate, wherein the first semiconductor area and the second semiconductor area are in physical contact with each other in the direction parallel to the upper surface of the substrate, wherein the first semiconductor area and the second semiconductor area each comprise a first Group V element and a second Group V element, wherein a ratio of the first Group V element and the second Group V element in the first semiconductor area is different from a ratio of the first Group V element and the second Group V element in the second semiconductor area.

14. The Group III-V compound semiconductor device of claim 1, wherein the first semiconductor area and the second semiconductor area commonly comprise Sb.

15. The Group III-V compound semiconductor device of claim 13, wherein a distribution of the second Group V element in the first semiconductor area and a distribution of the second Group V element in the second semiconductor area are changed along the direction parallel to the upper surface of the substrate.

16. The Group III-V compound semiconductor device of claim 13, wherein a minimum concentration of the second Group V elements in the second semiconductor area is greater than a maximum concentration of the second Group V elements in the first semiconductor, and a maximum concentration of the first Group V elements in the second semiconductor area is less than a minimum concentration of the first Group V elements in the first semiconductor area.

17. The Group III-V compound semiconductor device of claim 1, wherein the first semiconductor area is provided in a pair, wherein the second semiconductor area is disposed between the pair of first semiconductor areas.

18. The Group III-V compound semiconductor device of claim 1, wherein the second semiconductor area is provided in a pair, wherein the first semiconductor area is disposed between the pair of second semiconductor areas.

* * * * *